United States Patent
Lee et al.

[11] Patent Number: 6,103,630
[45] Date of Patent: Aug. 15, 2000

[54] ADDING $SF_6$ GAS TO IMPROVE METAL UNDERCUT FOR HARDMASK METAL ETCHING

[75] Inventors: Yu-Hua Lee, Hsinchu; Chia-Shiung Tsai, Hsin-chu, both of Taiwan

[73] Assignee: Taiwan Semiconductor Manufacturing Company, Hsin-Chu, Taiwan

[21] Appl. No.: 09/020,501

[22] Filed: Feb. 9, 1998

[51] Int. Cl.[7] .......................... H01L 21/311; H01L 21/302
[52] U.S. Cl. .......................... 438/696; 438/700; 438/720; 438/717; 438/723; 438/742; 438/952; 438/627; 216/64; 216/74; 216/75; 216/77; 216/58
[58] Field of Search .................................. 438/696, 627, 438/700, 720, 717, 723, 742, 952

[56] References Cited

U.S. PATENT DOCUMENTS

| | | | |
|---|---|---|---|
| 4,214,946 | 7/1980 | Forget et al. | 156/643 |
| 4,741,799 | 5/1988 | Chen et al. | 156/643 |
| 4,855,016 | 8/1989 | Jucha et al. | 156/643 |
| 5,126,008 | 6/1992 | Levy | 156/643 |
| 5,217,570 | 6/1993 | Kadomura | 156/665 |
| 5,326,427 | 7/1994 | Jerbic | 156/643 |
| 5,540,812 | 7/1996 | Kadomura | 156/652.1 |
| 5,780,315 | 7/1998 | Chao et al. | 438/8 |
| 5,827,437 | 10/1998 | Yang et al. | 216/77 |

*Primary Examiner*—Maria Nuzzolillo
*Assistant Examiner*—Angela J. Martin
*Attorney, Agent, or Firm*—George O. Saile; Stephen B. Ackerman; Rosemary L. S. Pike

[57] ABSTRACT

A new method of etching metal lines using $SF_6$ gas during the overetch step to prevent undercutting of the anti-reflective coating layer is described. Semiconductor device structures are provided in and on a semiconductor substrate. The semiconductor device structures are covered with an insulating layer. A barrier metal layer is deposited overlying the insulating layer. A metal layer is deposited overlying the barrier metal layer. A silicon oxide layer is deposited overlying the metal layer. The silicon oxide layer is covered with a layer of photoresist which is exposed, developed, and patterned to form the desired photoresist mask. The silicon oxide layer is etched away where it is not covered by the photoresist mask leaving a patterned hard mask. The metal layer is etched away where it is not covered by the patterned hard mask to form metal lines. Overetching is performed to remove the barrier layer where it is not covered by the hard mask wherein $SF_6$ gas is one of the etchant gases used in the overetching whereby fluorine ions from the $SF_6$ gas react with the metal layer and the barrier metal layer to form a passivation layer on the sidewalls of the metal lines thereby preventing undercutting of the metal lines resulting in metal lines having a vertical profile. The photoresist mask is removed and fabrication of the integrated circuit device is completed.

17 Claims, 4 Drawing Sheets

ADDING SF$_6$ GAS TO IMPROVE METAL UNDERCUT FOR HARDMASK METAL ETCHING

BACKGROUND OF THE INVENTION

(1) Field of the Invention

The invention relates to a method of photolithographic etching of metal lines, and more particularly, to a method of photolithographic etching of sub-quarter micron metal lines without undercutting in the manufacture of integrated circuits.

(2) Description of the Prior Art

It is desired for metal lines to have a vertical profile. This is not always easy to achieve, especially for sub-quarter micron metal lines where the photoresist mask must become thinner to improve lithographic resolution. Because of poor photoresist selectivity, especially with a deep ultraviolet (DUV) light source, metal etching using a hard mask; i.e. an oxide mask; will be the trend for sub-quarter micron logic technology. Thus, metal sidewall. protection becomes even more important than previously.

FIG. 1 illustrates in cross-sectional representation a partially completed integrated circuit device of the prior art. Semiconductor substrate 40 contains semiconductor device structures, not shown. A metal line stack is shown on the substrate. Barrier metal layer 44 (for example, titanium/titanium nitride) is on the bottom of the stack. The metal layer 46, such as AlCu, overlies the barrier layer. An antireflective coating (ARC) 48 is at the top of the stack. Silicon oxide hard mask 50 has been formed over the ARC layer using the pattern of the photoresist mask 52.

Conventionally, the metal lines are etched using the etchant gases $BCl_3$, $Cl_2$, and $N_2$. Etching continues until the time that the mean metal stack thickness is etched through. Then, because of thickness and etch rate non-uniformities in all etching processes, the metal stack is overetched for a time sufficient to completely etch through all of the desired material. In addition, the barrier metal layer is etched through in the overetching step. It has been found that the metal sidewalls will not be attacked if $BCl_3$ is not used during this overetching. However, an undercut 54 will be found near the ARC interface with the metal layer 24, as shown in FIG. 2. $Cl_2$ will attack the metal line near the interface at the end of the etching time. The $N_2$ chemical passivation (C—N bond) cannot prevent the $Cl_2$ erosion effectively, but only smooths the metal sidewall.

U.S. Pat. No. 4,855,016 to Jucha et al teaches etching tungsten with $SF_6$ alone or in combination with a bromine source and teaches etching aluminum using $BCl_3$ and $Cl_2$ gases. U.S. Pat. No. 5,126,008 to Levy teaches etching aluminum using $SF_6$ and bromine. U.S. Pat. No. 4,214,946 to Forget et al teaches using $Cl_2$ and $SF_6$ to etch silicon. U.S. Pat. No. 4,741,799 to Chen et al etches silicon using $SF_6$ and a hydrocarbon. U.S. Pat. Nos. 5,217,570 and 5,540,812 to Kadomura teach etching of a barrier layer using $S_2F_2$ to form a sulfur-based sidewall protection for a metal layer. U.S. Pat. No. 5,326,427 to Jerbic teaches using atomic chlorine and atomic fluorine to etch titanium, but not aluminum. Co-pending U.S. patent application Ser. No. 08/998,673 (TSMC-97-210) to Shue et al teaches using a fluorine-doped silicate glass hard mask to prevent undercutting of metal lines during etching,

SUMMARY OF THE INVENTION

A principal object of the present invention is to provide an effective and very manufacturable method of etching metal lines.

Another object of the present invention is to provide a method of etching metal lines without undercutting of the metal lines.

A further object of the present invention is to provide a method of etching metal lines having a vertical etching profile.

Yet another object of the present invention is to provide a method of etching metal lines without undercutting of the anti-reflective coating layer.

A still further object of the present invention is to provide a method of etching metal lines using $SF_6$ gas during the overetch step.

Yet another object of the present invention is to provide a method of etching metal lines using $SF_6$ gas during the overetch step to prevent undercutting of the anti-reflective coating layer.

In accordance with the objects of this invention a new method of etching metal lines using $SF_6$ gas during the overetch step to prevent undercutting of the anti-reflective coating layer is achieved. Semiconductor device structures are provided in and on a semiconductor substrate. The semiconductor device structures are covered with an insulating layer. A barrier metal layer is deposited overlying the insulating layer. A metal layer is deposited overlying the barrier metal layer. A silicon oxide layer is deposited overlying the metal layer. The silicon oxide layer is covered with a layer of photoresist which is exposed, developed, and patterned to form the desired photoresist mask. The silicon oxide layer is etched away where it is not covered by the photoresist mask leaving a patterned hard mask. The metal layer is etched away where it is not covered by the patterned hard mask to form metal lines. Overetching is performed to remove the barrier layer where it is not covered by the hard mask wherein $SF_6$ gas is one of the etchant gases used in the overetching whereby fluorine ions from the $SF_6$ gas react with the metal layer and the barrier metal layer to form a passivation layer on the sidewalls of the metal lines thereby preventing undercutting of the metal lines resulting in metal lines having a vertical profile. The photoresist mask is removed and fabrication of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in first level metallization, as shown in FIGS. 3–7. The process of the invention can be used also in second and third level metal lines, and so on. It should be understood that the process of the invention is not limited to the embodiment illustrated in FIGS. 3–7 wherein a first level metallization is formed, but is equally applicable to higher level metallization.

Figure 1:
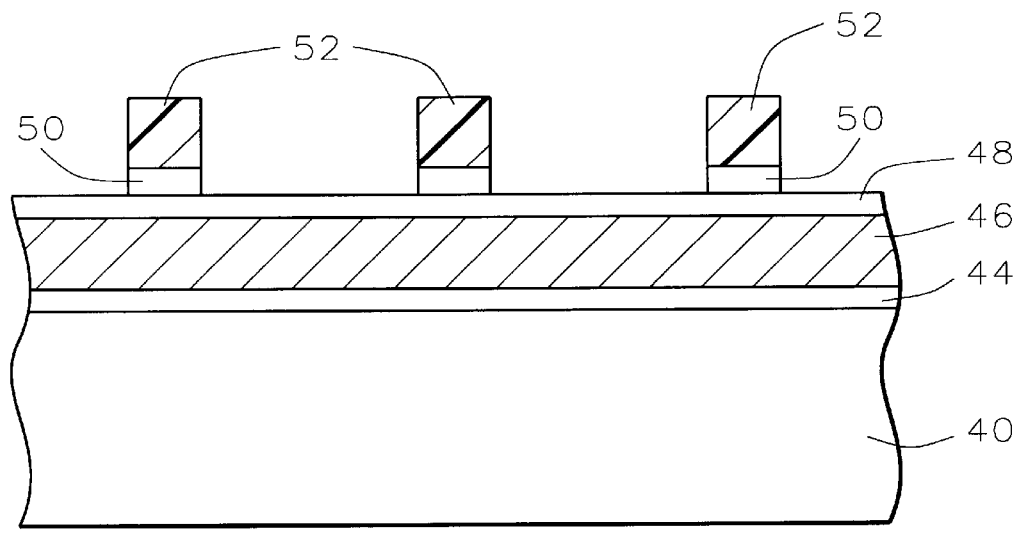
FIGS. 1 and 2 schematically illustrate in cross-sectional representation etching problems of the prior art.
Figure 2:
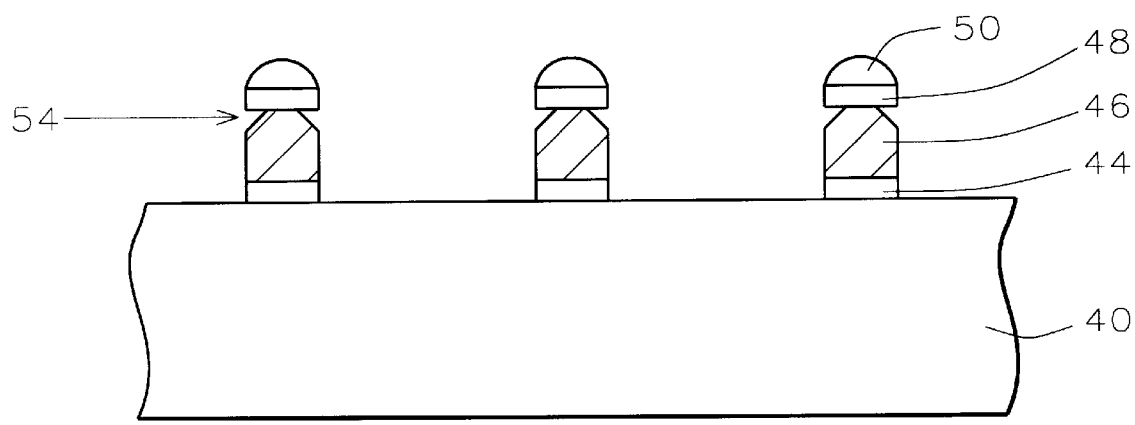
Figure 3:
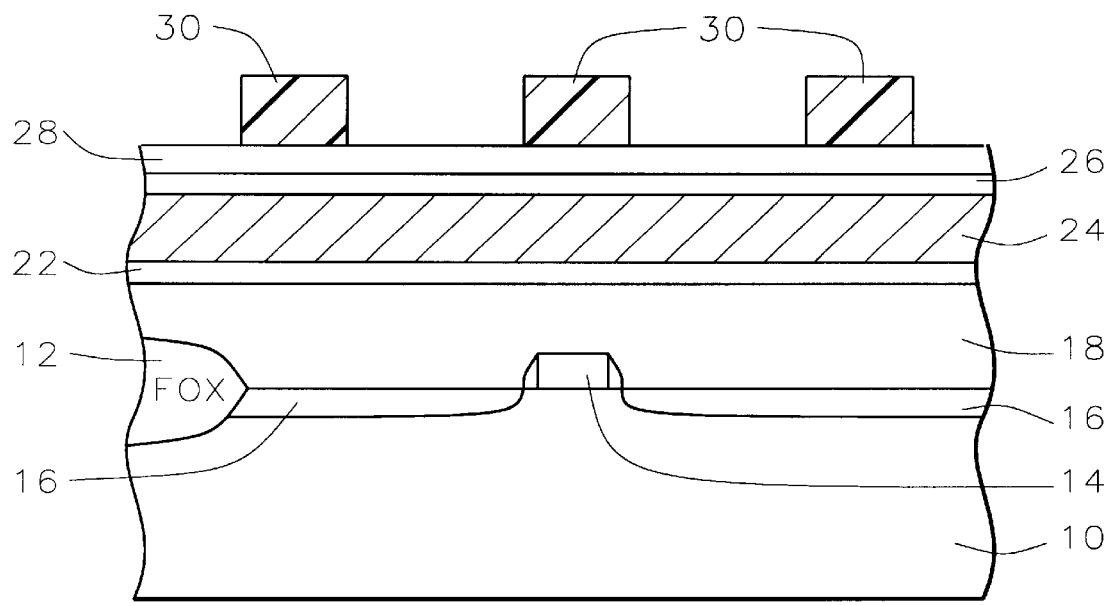
FIGS. 3 through 7 schematically illustrate in cross-sectional representation a preferred embodiment of the present invention.

Referring now more particularly to FIG. 3, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, including gate electrode 14 and source and drain regions 16, are fabricated in and on the semiconductor substrate. A thick insulating layer of silicon dioxide or borophosphosilicate glass (BPSG), or the like, 18 is blanket deposited over the semiconductor device structures.

Next, a barrier layer 22 is deposited over the insulating layer. This may be titanium and titanium nitride with a combined thickness of between about 500 and 1500 Angstroms.

The metal layer 24 is deposited over the barrier layer 22. The metal layer comprises aluminum or an aluminum alloy such as AlSi, AlCu, or AlCuSi and is sputter deposited to a thickness of between about 2500 and 5000 Angstroms. An antireflective coating (ARC) 26, such as titanium, titanium nitride, or silicon oxynitride is deposited over the metal layer 24 to a thickness of between about 300 and 1400 Angstroms.

A layer of silicon oxide or oxynitride 28 is deposited over the ARC layer to a thickness of between about 500 and 2000 Angstroms. This layer will form the hard mask for etching the metal lines.

A layer of photoresist is coated over the hard mask 28 and is exposed and developed to form the photoresist mask 30. The photoresist mask can be as thin as 5000 to 10,000 Angstroms. Using DUV photolithography instead of conventional i-line photolithography allows the use of a thinner photoresist layer. This thinner photoresist mask is essential for sub-quarter micron technology. The use of the silicon oxide hard mask allows for this thinner photoresist mask.

Figure 4:
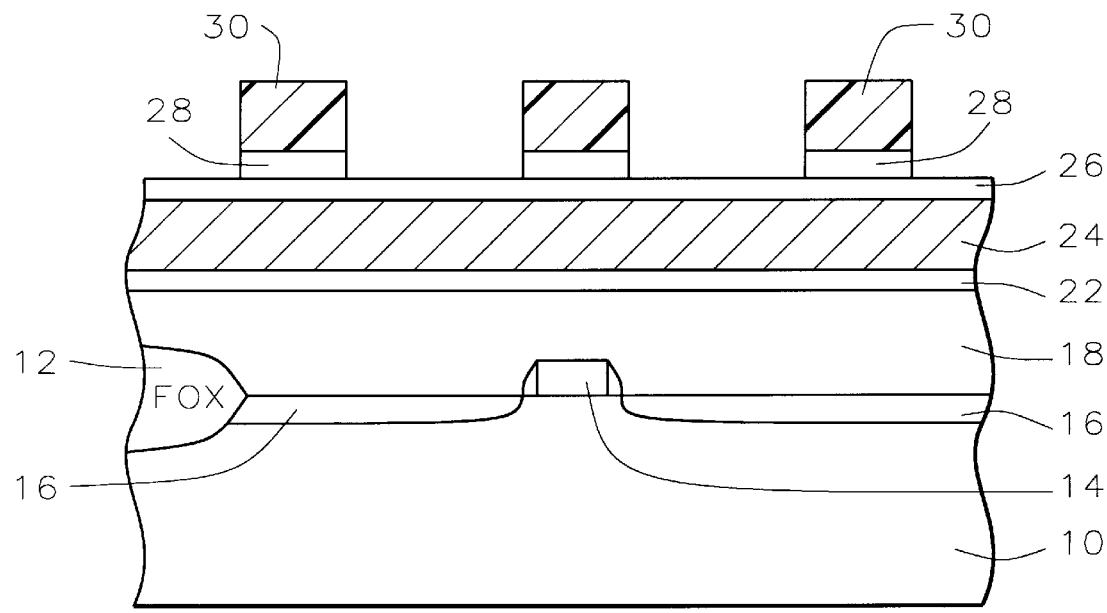

The silicon oxide hard mask 28 layer is etched away where it is not covered by the photoresist mask 30, as illustrated in FIG. 4 to form the silicon oxide hard mask.

Figure 5:
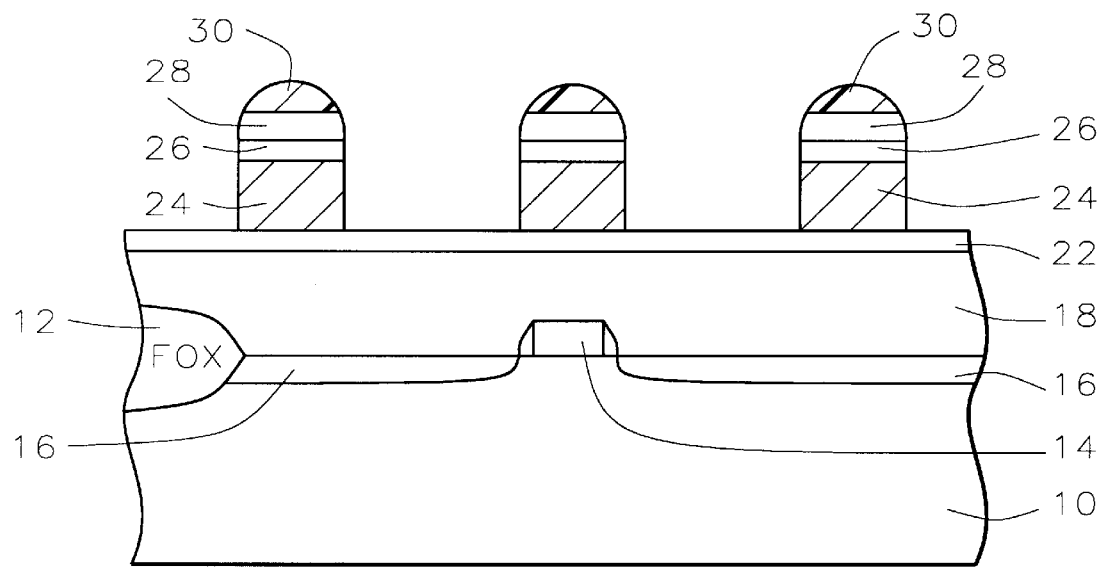
Figure 6:
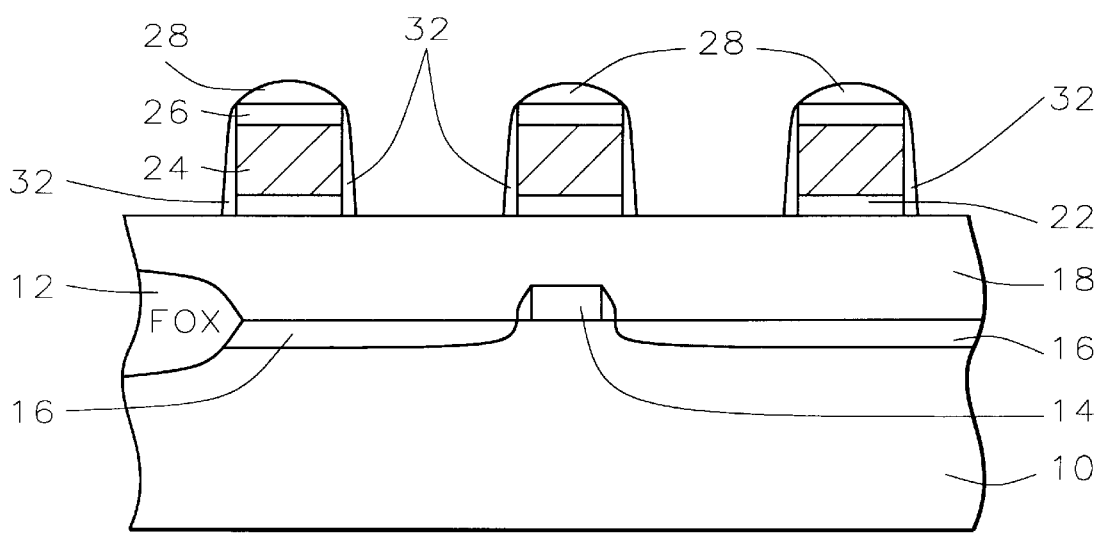

Now, the metal line stack is to be etched away where it is not covered by the hard mask, as illustrated in FIG. 5. Conventional etchant gases including $BCl_3$, $Cl_2$, and $N_2$ are used for this etching. For example, $BCl_3$ is flowed at 15 to 60 sccm, $Cl_2$ is flowed at 60 to 100 sccm and $N_2$ is flowed at 10 to 50 sccm at a pressure of 6 to 10 mTorr and power of 150 to 250 watts. The metal line stack is etched until all of the metal layer 24 not covered by the mask is etched away. The first part of the overetch step makes sure all of the metal layer is etched away.

The process of the present invention uses $SF_6$ gas in place of $BCl_3$ gas for the second part of the overetch step to etch away the barrier layer. The absence of the $BCl_3$ gas during the overetch step will prevent etching away of the metal line sidewalls. However, the undercutting of the metal lines at the ARC interface will still occur. The addition of $SF_6$ gas during the overetch will prevent the undercutting of the metal lines at the ARC interface. The $SF_6$ gas will react with the aluminum or aluminum alloy to form the nonvolatile product $AlF_x$. The $AlF_x$ forms a passivation layer 32 on the sidewalls of the metal stack, thus preventing undercutting.

For example, in the overetch step, $SF_6$ gas is flowed at 10 to 30 sccm, $Cl_2$ is flowed at 60 to 100 sccm, and $N_2$ is flowed at 10 to 50 sccm at a pressure of 6 to 10 mTorr and power of 200 to 250 watts.

The inventors have implemented the process of the invention and compared it to the conventional approach. It has been found that the oxide loss in the spaces between the dense metal lines is the same for both the conventional approach and the process of the invention. Therefore, the addition of $SF_6$ gas does not increase oxide loss. It has been found that the critical dimension bias (metal width after etching minus metal mask width before etching) is also the same in both the conventional approach and in the process of the invention. Because of the high selectivity of metal to oxide, the critical dimension bias is strongly dependent upon the hard mask profile and upon overetch time. Scanning Electron Microscope (SEM) profiles have shown that metal undercutting is decreased dramatically by using the $SF_6$ gas overetch step of the present invention.

Figure 7:
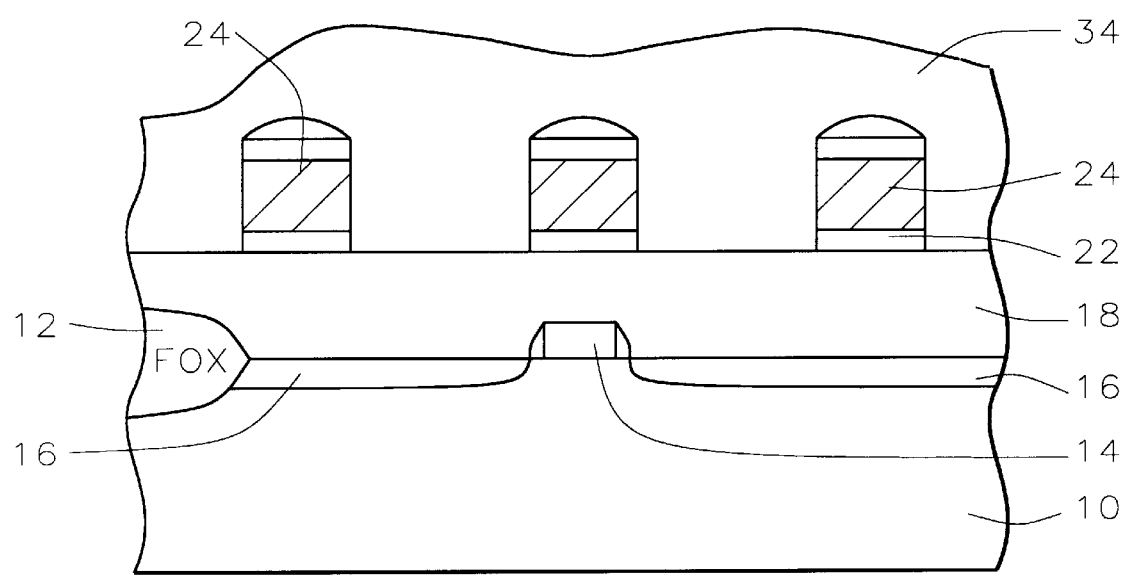

FIG. 7 shows the completed metal lines 24 having a vertical profile. The sidewall passivation 32 is removed by conventional resist stripping. Intermetal dielectric or passivation layer 34 is deposited over the metal lines. Another level of metallization now may be fabricated according to the process of the present invention.

The process of the invention adds $SF_6$ gas to the overetch step in place of $BCl_3$ gas. The $SF_6$ gas reacts with the metal line to form $AlF_x$ which protects the sidewall of the metal line during overetching.

While the invention has been particularly shown and described with reference to the preferred embodiments thereof, it will be understood by those skilled in the art that various changes in form and details may be made without departing from the spirit and scope of the invention.

What is claimed is:

1. A method of forming metal lines having a vertical profile in the fabrication of an integrated circuit comprising:
   providing semiconductor device structures in and on a semiconductor substrate;
   covering said semiconductor device structures with an insulating layer;
   depositing a barrier metal layer overlying said insulating layer;
   depositing a metal layer overlying said barrier metal layer;
   depositing a silicon oxide layer overlying said metal layer;
   covering said silicon oxide layer with a layer of photoresist;
   exposing said photoresist layer to actinic light and developing and patterning said photoresist layer to form the desired photoresist mask;
   etching away said silicon oxide layer where it is not covered by said photoresist mask leaving a patterned hard mask;
   etching away said metal layer not covered by said patterned hard mask to form said metal lines wherein said etching is performed by the etchant gases $BCl_3$, $Cl_2$, and $N_2$;
   overetching to remove said barrier layer where it is not covered by said hard mask wherein said overetching is Performed by the etchant gases $SF_6$, $Cl_2$, and $N_2$ in whereby fluorine ions from said $SF_6$ gas react with said metal layer to form a passivation layer on the sidewalls of said metal lines thereby preventing undercutting of said metal lines resulting in said metal lines having said vertical profile;
   removing said photoresist mask; and
   completing said fabrication of said integrated circuit.

2. The method according to claim 1 wherein said semiconductor device structures include gate electrodes and source and drain regions.

3. The method according to claim 1 wherein said barrier layer comprises titanium and titanium nitride with a combined thickness of between about 500 and 1500 Angstroms.

4. The method according to claim 1 wherein said metal layer comprises AlCu having a thickness of between about 2500 and 5000 Angstroms.

5. The method according to claim 1 further comprising depositing an anti-reflective coating layer overlying said metal layer wherein said antireflective coating layer comprises titanium.

6. The method according to claim 1 wherein said silicon oxide layer has a thickness of between about 500 and 2000 Angstroms.

7. The method according to claim 1 wherein said photoresist layer has a thickness of between about 5000 and 10,000 Angstroms.

8. The method according to claim 1 wherein said overetching comprises flowing $Cl_2$ gas at the rate of 60 to 100 sccm, flowing $N_2$ at the rate of 10 to 50 sccm, and flowing $SF_6$ at the rate of 10 to 30 sccm at a pressure of 6 to 10 mTorr and power of 200 to 250 watts.

9. The method according to claim 1 wherein said passivation layer comprises $AlF_x$.

10. A method of forming metal lines having a vertical profile in the fabrication of an integrated circuit comprising:

providing semiconductor device structures in and on a semiconductor substrate;

covering said semiconductor device structures with an insulating layer;

depositing a barrier metal layer overlying said insulating layer;

depositing an aluminum layer overlying said barrier metal layer;

depositing an anti-reflective coating layer overlying said aluminum layer;

depositing a silicon oxide layer overlying said anti-reflective coating layer;

covering said silicon oxide layer with a layer of photoresist;

exposing said photoresist layer to actinic light and developing and patterning said photoresist layer to form the desired photoresist mask;

etching away said silicon oxide layer where it is not covered by said photoresist mask leaving a patterned hard mask;

etching away said aluminum layer not covered by said patterned hard mask to form said metal lines wherein said etching is performed by the etchant gases $BCl_3$, $Cl_2$, and $N_2$;

overetching to remove said barrier layer where it is not covered by said hard mask wherein said overetching is performed by the etchant gases $SF_6$, $Cl_2$, and $N_2$ whereby fluorine ions from said $SF_6$ gas react with said aluminum layer to form a $AlF_x$ passivation layer on the sidewalls of said metal lines thereby preventing undercutting of said metal lines resulting in said metal lines having said vertical profile;

removing said photoresist mask; and completing said fabrication of said integrated circuit.

11. The method according to claim 10 wherein said semiconductor device structures include gate electrodes and source and drain regions.

12. The method according to claim 10 wherein said barrier layer comprises titanium and titanium nitride with a combined thickness of between about 500 and 1500 Angstroms.

13. The method according to claim 10 wherein said metal layer comprises AlCu having a thickness of between about 2500 and 5000 Angstroms.

14. The method according to claim 10 wherein said anti-reflective coating layer comprises titanium.

15. The method according to claim 10 wherein said silicon oxide layer has a thickness of between about 300 and 2000 Angstroms.

16. The-method according to claim 10 wherein said photoresist layer has a thickness of between about 5000 and 10,000 Angstroms.

17. The method according to claim 10 wherein said overetching comprises flowing $Cl_2$ gas at the rate of 60 to 100 sccm; flowing $N_2$ at the rate of 10 to 50 sccm, and flowing $SF_6$ at the rate of 10 to 30 sccm at a pressure of 6 to 10 mTorr and power of 200 to 250 watts.

* * * * *